US009996098B2

(12) United States Patent
Kim et al.

(10) Patent No.: US 9,996,098 B2
(45) Date of Patent: Jun. 12, 2018

(54) VOLTAGE GENERATION CIRCUIT AND INTEGRATED CIRCUIT INCLUDING THE SAME

(71) Applicant: SK hynix Inc., Gyeonggi-do (KR)

(72) Inventors: Kyeong-Tae Kim, Gyeonggi-do (KR); Chang-Hyun Lee, Gyeonggi-do (KR); Jae-Boum Park, Gyeonggi-do (KR); Saeng-Hwan Kim, Gyeonggi-do (KR)

(73) Assignee: SK Hynix Inc., Gyeoggi-do (KR)

( * ) Notice: Subject to any disclaimer, the term of this patent is extended or adjusted under 35 U.S.C. 154(b) by 0 days. days.

(21) Appl. No.: 15/199,389

(22) Filed: Jun. 30, 2016

(65) Prior Publication Data

US 2017/0235324 A1 Aug. 17, 2017

(30) Foreign Application Priority Data

Feb. 15, 2016 (KR) ........................ 10-2016-0017005

(51) Int. Cl.

*G11C 5/14* (2006.01)
*G05F 3/08* (2006.01)
*G11C 11/4074* (2006.01)

(52) U.S. Cl.

CPC ...................................... *G05F 3/08* (2013.01)

(58) Field of Classification Search

CPC ........... G11C 5/14; G11C 5/146; G11C 5/147; G11C 5/148; G11C 11/4074; G11C 16/30; G05F 1/567

See application file for complete search history.

(56) References Cited

U.S. PATENT DOCUMENTS

| | | | | | |
|---|---|---|---|---|---|
| 6,897,683 | B2 * | 5/2005 | Kernahan | H02M 3/157 | 326/27 |
| 8,031,550 | B2 | 10/2011 | Chen | | |
| 2008/0258801 | A1 * | 10/2008 | Gou | H02M 3/07 | 327/536 |
| 2009/0243704 | A1 * | 10/2009 | Kang | G11O 5/145 | 327/513 |
| 2011/0156805 | A1 * | 6/2011 | Kwon | H02M 1/36 | 327/536 |

* cited by examiner

*Primary Examiner* — Gary L Laxton
(74) *Attorney, Agent, or Firm* — IP & T Grou LLP

(57) ABSTRACT

A voltage generation circuit includes: a periodic wave generator that generates an on/off signal that is periodically enabled/disabled, where at least one between a period and a duty cycle of the on/off signal is controlled based on at least one information among temperature information, capacitance information, leakage current information, speed information, and voltage level information; and an internal voltage generator that is enabled/disabled in response to the on/off signal and generates an internal voltage.

5 Claims, 9 Drawing Sheets

VOLTAGE GENERATION CIRCUIT AND INTEGRATED CIRCUIT INCLUDING THE SAME

CROSS-REFERENCE TO RELATED APPLICATIONS

The present application claims priority under 35 U.S.C. § 119(a) of Korean Patent Application No. 10-2016-0017005, filed on Feb. 15, 2016, which is incorporated herein by reference in its entirety.

BACKGROUND

1. Field

Exemplary embodiments of the present invention relate to a voltage generation circuit and an integrated circuit including the voltage generation circuit.

2. Description of the Related Art

Diverse integrated circuits receive an external voltage and operate their internal circuits with the external voltage. However, since the internal circuits of the integrated circuits operate at various voltages, it is difficult to supply all the required voltages for an integrated circuit from an external power source. Therefore, typically, an integrated circuit may be provided with internal voltage generation circuits for generating a plurality of internal voltages which are different from an externally supplied voltage.

However, the voltage generation circuits, continuously consume current to generate the internal voltages. The current consumption of the voltage generation circuits adds greatly to the overall power consumption of an integrated circuit.

SUMMARY

Various embodiments of the present invention are directed to an improved voltage generation circuit exhibiting reduced current consumption, and an integrated circuit including the improved voltage generation circuit.

In accordance with an embodiment of the present invention, a voltage generation circuit includes: a periodic wave generator that generates an on/off signal that is periodically enabled/disabled, where at least one between a period and a duty of the on/off signal is controlled based on at least one information among temperature information, capacitance information, leakage current information, speed information, and voltage level information; and an internal voltage generator that is enabled/disabled in response to the on/off signal and generates an internal voltage.

The temperature information may be generated in a temperature sensor that is mounted on an integrated circuit including the voltage generation circuit.

The capacitance information, leakage current information, and voltage level information may be stored in a non-volatile memory device that stores values determined during a test of the integrated circuit including the voltage generation circuit.

The speed information may be stored in a register that stores setup information of the integrated circuit including the voltage generation circuit.

The periodic wave generator may include: an oscillation unit that generates a periodic wave; a dividing unit that divides the periodic wave into a plurality of divided periodic waves; a logic combination unit that logically combines the plurality of the divided periodic waves and thereby generates preliminary on/off signals having diverse frequencies and duties; and a selection unit that selects one signal among the preliminary on/off signals as the on/off signal in response to at least one information among the temperature information, the capacitance information, the leakage current information, the speed information, and the voltage level information.

The on/off signal may be periodically enabled/disabled in a first mode, and maintained in an enabled state in a second mode.

In accordance with another embodiment of the present invention, a voltage generation circuit includes: a first internal voltage generator that is enabled/disabled in response to a first on/off signal which is enabled/disabled periodically, and generates a first internal voltage; and a second internal voltage generator that is enabled/disabled in response to a second on/off signal which is enabled/disabled periodically, and generates a second internal voltage based on the first internal voltage, wherein an enabling time period of the second on/off signal belongs to an enabling time period of the first on/off signal.

The enabling time period of the first on/off signal may be wider than the enabling time period of the second on/off signal.

The voltage generation circuit may further include: an on/off splitter that generates the second on/off signal by logically combining the first on/off signal with a periodic wave.

The first on/off signal and the second on/off signal may be periodically enabled/disabled in a first mode, and maintained in an enabled state in a second mode.

In accordance with yet another embodiment of the present invention, a voltage generation circuit includes: a voltage sensor that is enabled/disabled in response to a first on/off signal which is enabled/disabled periodically, and generates a pump need signal by sensing a level of a pumping voltage; and a charge pump that is enabled in a time period where a second on/off signal which is enabled/disabled periodically and the pump need signal are enabled and generates the pumping voltage.

An enabling time period of the second on/off signal may belong to an enabling time period of the first on/off signal.

The enabling time period of the first on/off signal may be wider than the enabling time period of the second on/off signal.

The voltage generation circuit may further include: an on/off splitter that generates the second on/off signal by logically combining the first on/off signal with a periodic wave.

The voltage generation circuit may further include: a pump enable controller that enables a pump enable signal for enabling the charge pump when the pump need signal and the second on/off signal are enabled.

The first on/off signal and the second on/off signal may be periodically enabled/disabled in a first mode, and maintained in an enabled state in a second mode.

In accordance with still another embodiment of the present invention, an integrated circuit includes: an internal voltage generator that is enabled/disabled in response to an on/off signal and generates a reference voltage; and a first reception circuit that compares a first input signal with the reference voltage and thereby receives a first input signal, wherein the on/off signal is periodically enabled/disabled in a first mode and maintained in an enabled state in a second mode.

The first mode may be a mode where the first input signal is not inputted, and the second mode may be a mode where the first input signal is inputted.

The integrated circuit may be a memory device, and the first mode may be enabled in a time period where there is no active row in the memory device, and the second mode may be enabled in a time period where there is an active row in the memory device.

The integrated circuit may further include: second to $N^{th}$ reception circuits that compare corresponding second to $N^{th}$ input signals with the reference voltage and receive the corresponding second to $N^{th}$ input signals, where N is an integer greater than 2.

In accordance with still another embodiment of the present invention, a voltage generation circuit includes: a first internal voltage generator that is enabled when an on/off signal which is enabled/disabled periodically is in a first level, and generates an internal voltage; and a second internal voltage generator that is enabled when the on/off signal is in a second level, and generates the internal voltage, wherein the first internal voltage generator has a stronger voltage driving force than the second internal voltage generator.

The on/off signal may be periodically enabled/disabled in a first mode, but fixed to one level between the first level and the second level in a second mode.

DETAILED DESCRIPTION

Figure 1:
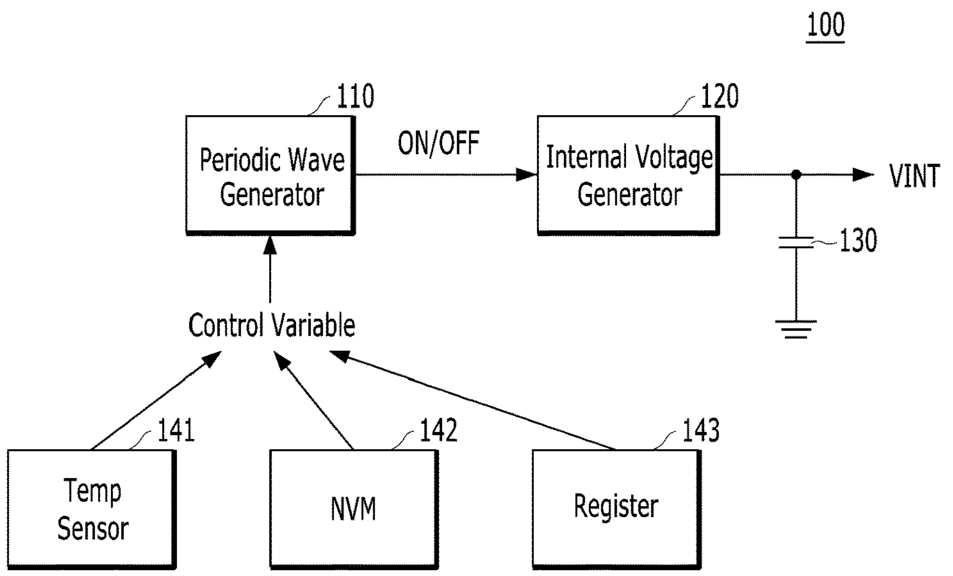
FIG. 1 is a schematic diagram of a voltage generation circuit 100, according to a first embodiment of the present invention.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete. Throughout the disclosure, like reference numerals refer to like parts throughout the various figures and embodiments of the present invention.

Referring to FIG. 1, a voltage generation circuit 100 is provided, according to a first embodiment of the present invention. The voltage generation circuit 100 may include a periodic wave generator 110, an internal voltage generator 120, and a capacitor 130.

The periodic wave generator 110 may generate an on/off signal ON/OFF that is periodically enabled or disabled. At least one of a period and a duty cycle of the on/off signal ON/OFF may be controlled based on a control variable.

The internal voltage generator 120 may generate an internal voltage VINT. The capacitor 130 may maintain the generated internal voltage VINT at a constant level. When the on/off signal ON/OFF is enabled, the internal voltage generator 120 may be enabled to consume a current and thereby supply the internal voltage VINT. When the on/off signal ON/OFF is disabled, the internal voltage generator 120 may be disabled as well, not consuming the current.

While the internal voltage generator 120 is enabled, it may continuously consume a current. As the internal voltage generator 120 alternates between an enabled state and a disabled state, the current consumption of the internal voltage generator 120 may be reduced because no current is consumed when the internal voltage is disabled. Moreover, although the internal voltage generator 120 is not enabled continuously but it is enabled only periodically, the internal voltage VINT may be nevertheless maintained at a stable value by appropriately controlling the period and duty cycle of the on/off signal ON/OFF.

The control variable which may be used to control at least one of the period and the duty cycle of the on/off signal ON/OFF may include, for example, temperature information, capacitance information, leakage current information, speed information, voltage level information and the like.

For example, the temperature information may be a temperature of an integrated circuit including the voltage generation circuit 100. The temperature information may be generated in a temperature sensor 141 which may be mounted on the integrated circuit. Any suitable temperature sensor may be used. Generally, as the temperature of the integrated circuit increases a leakage current of the elements of the integrated circuit may also increase and the current consumption of the integrated circuit may be raised as a result, thus increasing the consumption of the internal voltage VINT. Thus, it is desirable to enable the internal voltage generator 120 more frequently when the temperature of the integrated circuit is raised and decrease the frequency when the temperature of the integrated circuit is lowered. Therefore, in an embodiment, the periodic wave generator 110 may control the period of the on/off signal ON/OFF as a function of the temperature of the integrated circuit with the frequency of the on/off signal ON/OFF increasing when the temperature increases and the frequency of the on/off signal ON/OFF decreasing when the temperature decreases. Also, it is desirable to enable the internal voltage generator 120 for a longer time as the temperature of the integrated circuit increases. Thus, the periodic wave generator 110 may control the duty cycle of the on/off signal ON/OFF to increase when the temperature increases and decrease when the temperature decreases.

The capacitance information may be information on a capacitance of the capacitor 130 of the voltage generation circuit 100. The capacitance information of the capacitor 130 may be measured during the fabrication of an integrated circuit and stored in a non-volatile memory 142 (e.g., a fuse circuit) mounted on the integrated circuit. For example, as the capacitance of the capacitor 130 becomes smaller, the internal voltage VINT may become less stable. Thus, it is desirable to enable the internal voltage generator 120 more frequently, as the capacitance of the capacitor 130 is decreased. Therefore, the periodic wave generator 110 may control the period of the on/off signal ON/OFF to be shorter, i.e., the frequency of the on/off signal ON/OFF to increase, as the capacitance becomes smaller. Also, as the capacitance becomes smaller, it is desirable to enable the internal voltage generator 120 for a longer time. Therefore, the periodic wave generator 110 may also control the duty cycle of the on/off signal ON/OFF to be increased, as the capacitance becomes smaller.

The leakage current information may be information on the leakage current of internal elements of the integrated circuit including the voltage generation circuit 100. The leakage current information may be measured during the fabrication of the integrated circuit and stored in a non-volatile memory 142 (e.g., fuse circuit) mounted on the integrated circuit. The more the leakage current increases, the less stable the internal voltage VINT becomes. Thus, it is desirable to enable the internal voltage generator 120 more frequently, as the leakage current is increased. Therefore, the periodic wave generator 110 may control the period of the on/off signal ON/OFF to be shorter, i.e., increase the frequency of the on/off signal ON/OFF, as the leakage current is increased. Also, as the amount of leakage current is increased, it is desirable to enable the internal voltage generator 120 for a longer time in a period. Therefore, the periodic wave generator 110 may control the duty cycle of the on/off signal ON/OFF to be increased, as the leakage current is increased.

The voltage level information may be information on the internal voltage VINT. The voltage level information on the internal voltage VINT may be stored in a non-volatile memory 142 (e.g., fuse circuit) mounted on the integrated circuit. As the internal voltage VINT is increased, the internal voltage VINT may become less stable more easily. Thus, as the internal voltage VINT is increased, it is desirable to enable the internal voltage generator 120 more frequently. Therefore, the periodic wave generator 110 may control the period of the on/off signal ON/OFF to be shorter as the internal voltage VINT is increased. Also, it is desirable to enable the internal voltage generator 120 for a longer time in each period as the internal voltage VINT is increased. Therefore, the periodic wave generator 110 may control the duty cycle of the on/off signal ON/OFF to be increased as the internal voltage VINT is increased.

The speed information may be information on an operation speed of the integrated circuit including the voltage generation circuit 100. The speed information may be stored in a register 143 for storing setup information on the operation speed of the integrated circuit. As the integrated circuit operates faster and faster, the internal voltage VINT may easily become less stable. Thus, it is desirable to enable the internal voltage generator 120 more frequently, as the operation speed of the integrated circuit becomes faster. Therefore, the periodic wave generator 110 may control the period of the on/off signal ON/OFF to be shorter, as the operation speed of the integrated circuit becomes faster. Also, it is desirable to enable the internal voltage generator 120 for a longer time in each period, as the operation speed of the integrated circuit becomes faster. Therefore, the periodic wave generator 110 may control the duty cycle of the on/off signal ON/OFF to be increased as the operation speed of the integrated circuit becomes faster.

Figure 2:
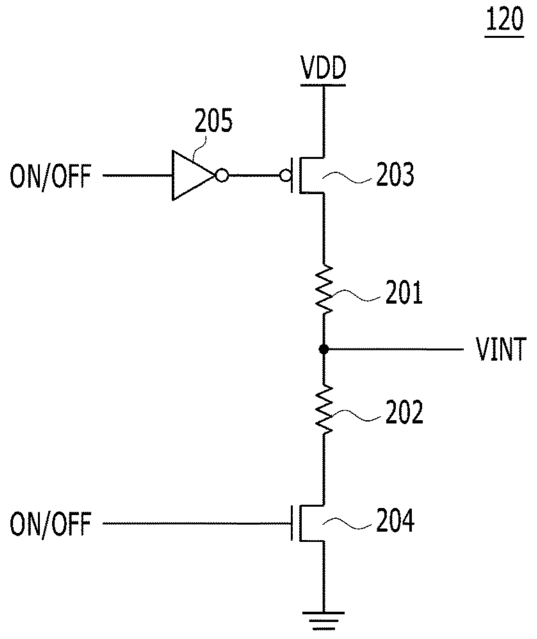
FIG. 2 is a circuit diagram of an internal voltage generator shown in FIG. 1, according to an embodiment of the present invention.

FIG. 2 provides an example circuit diagram for the internal voltage generator 120 of FIG. 1, according to an embodiment of the present invention. According to the embodiment of FIG. 2, the internal voltage generator 120 may include resistors 201 and 202 for dividing a voltage, PMOS transistors 203 and 204 for enabling/disabling the internal voltage generator 120 in response to the on/off signal ON/OFF, and an inverter 205.

When the on/off signal ON/OFF is enabled to a logic high level, the transistors 203 and 204 are turned on. Therefore, a power source voltage VDD may be divided by the resistors 201 and 202 to generate the internal voltage VINT.

When the on/off signal ON/OFF is disabled to a logic low level, the transistors 203 and 204 are turned off. As the transistors 203 and 204 are turned off, no current may flow through the resistors 201 and 202 and thus the internal voltage generator 120 may not supply the internal voltage VINT.

FIG. 2 exemplarily shows that the internal voltage generator 120 may generate the internal voltage VINT by dividing the power source voltage VDD. However, it is obvious to those skilled in the art that other diverse methods may be used to generate the internal voltage VINT in the internal voltage generator 120. The resistors 201 and 202 may be the same or different. Also, instead of two resistors a greater number of resistors may be used to generate a plurality internal voltages having different values.

Figure 3:
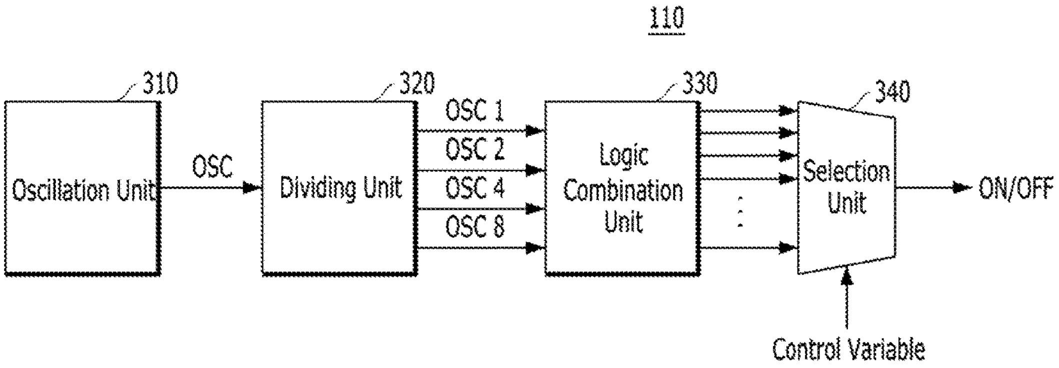
FIG. 3 is a schematic diagram of a periodic wave generator shown in FIG. 1, according to an embodiment of the present invention.

Referring to FIG. 3, a periodic wave generator 110 shown in FIG. 1 according to an embodiment of the present invention may include an oscillation unit 310, a dividing unit 320, a logic combination unit 330, and a selection unit 340.

The oscillation unit 310 may generate a periodic wave OSC. FIG. 3 exemplarily shows that the selection unit 340 is controlled based on a control variable. Alternatively, the oscillation unit 310 may be controlled based on a control variable so that the period of the periodic wave OSC may be controlled based on the control variable.

The dividing unit 320 may divide the periodic wave OSC into a plurality of divided periodic waves OSC1, OSC2, OSC4 and OSC8. The divided periodic wave OSC2 may be a periodic wave obtained by dividing a frequency of the periodic wave OSC by two, i.e., the frequency of the wave OSC2 may be half of the frequency of the wave OSC1. For example, the divided periodic wave OSC2 may be a periodic wave having a period twice as long as that of the periodic wave OSC. The divided periodic wave OSC4 may be a periodic wave obtained by dividing the frequency of the periodic wave OSC by 4, i.e., the frequency of wave OSC4 may be ¼ of the frequency of the wave OSC1. The divided periodic wave OSC8 may be a periodic wave obtained by dividing the frequency of the periodic wave OSC by 8, i.e., the frequency of the wave OSC8 may be ⅛ of the frequency of the wave OSC1. The divided periodic wave OSC1 may be the same as the periodic wave OSC.

The logic combination unit 330 may generate preliminary on/off signals by logically combining the divided periodic waves OSC1, OSC2, OSC4 and OSC8. The preliminary on/off signals may have diverse periods and diverse duties. The structure and operation of the logic combination unit 330 may be described in detail later by referring to FIGS. 4 to 8.

The selection unit 340 may select one signal among the preliminary on/off signals generated in the logic combination unit 330 as an on/off signal ON/OFF. The selection operation of the selection unit 340 may be performed based on a control variable. As described earlier, the selection unit 340 may select the on/off signal ON/OFF based on at least one of a temperature information, capacitance information, leakage current information, voltage level information and speed information in such a manner that the period of the on/off signal ON/OFF may become longer or shorter and the duty cycle of the on/off signal ON/OFF may become increased or decreased.

Figure 4:
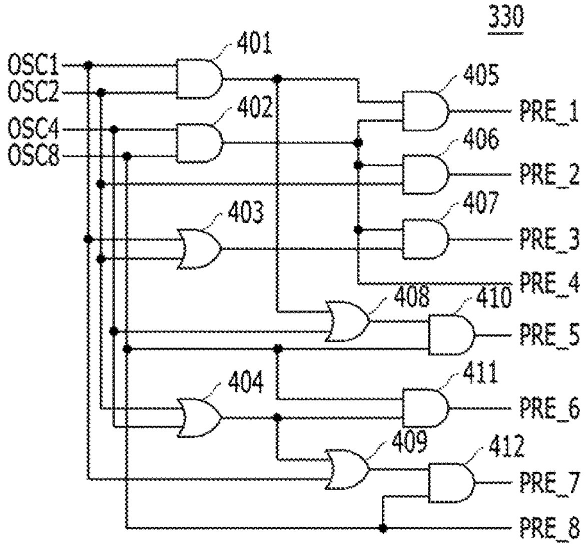
FIG. 4 is a circuit diagram of a logic combination unit shown in FIG. 3, according to an embodiment of the present invention.

Referring to FIG. 4, a logic combination unit 330 shown in FIG. 3, according to an embodiment of the present invention may include AND gates 401, 402, 405, 406, 407, 410, 411 and 412 and OR gates 403, 404, 408 and 409.

The logic combination unit 330 may generate preliminary on/off signals PRE_1, PRE_2, PRE_3, PRE_4, PRE_5, PRE_6, PRE_7 and PRE_8 by performing an AND operation and/or an OR operation of the AND gates 401, 402, 405, 406, 407, 410, 411 and 412 and the OR gates 403, 404, 408 and 409.

Figure 5:
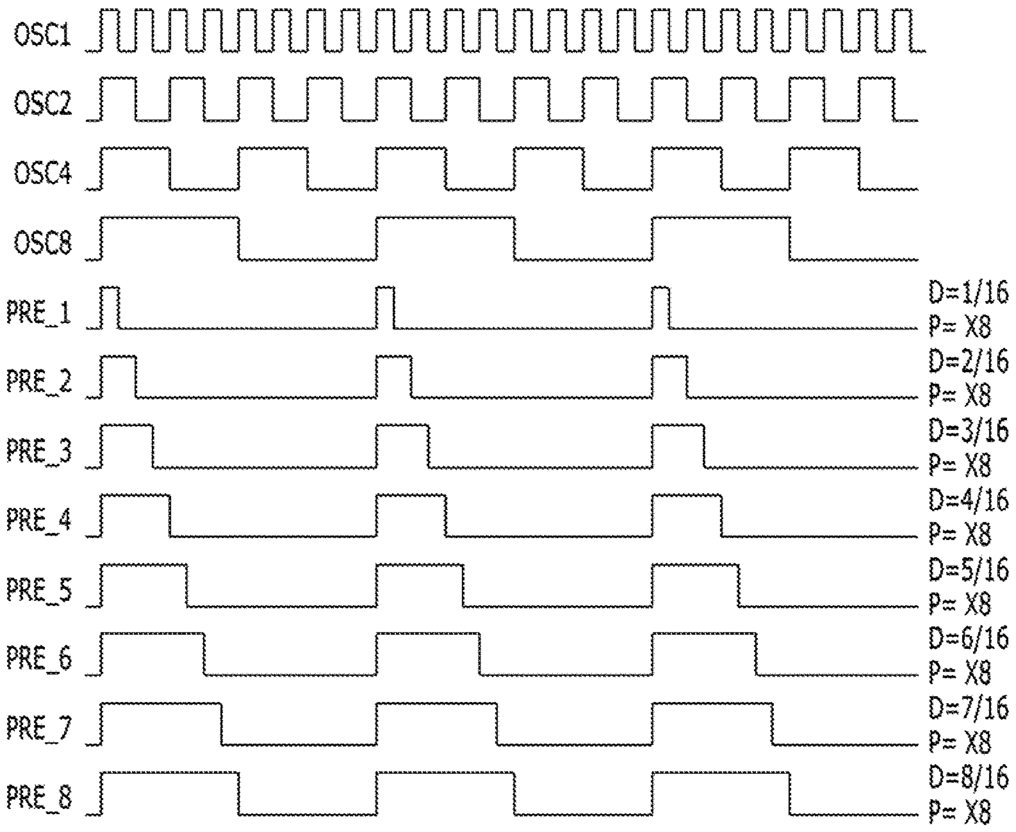
FIG. 5 is a timing diagram illustrating an operation of the logic combination unit of FIG. 4, according to an embodiment of the present invention.

In FIG. 5, a reference symbol 'D' placed next to the preliminary on/off signals PRE_1, PRE_2, PRE_3, PRE_4, PRE_5, PRE_6, PRE_7 and PRE_8 denotes the duty cycle of the corresponding signal, and a reference symbol 'P' denotes the period of the corresponding signal. For example, when D=$2/16$, it means that a length of the enabling time period of the corresponding signal is $2/16$ of one period of the corresponding signal. Also, 'P=×8' means that the period of the corresponding signal is 8 times as long as the that of the period of the divided wave.

Referring to FIG. 5, it may be seen that 8 preliminary on/off signals PRE_1, PRE_2, PRE_3, PRE_4, PRE_5, PRE_6, PRE_7 and PRE_8 are generated with different duty cycles, although their periods are the same due to the logic combination operation performed by the logic combination unit 330.

Figure 6:
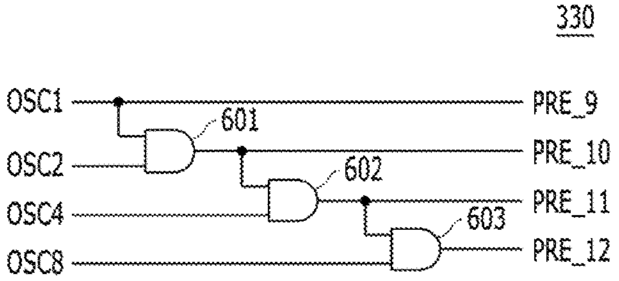
FIG. 6 is a circuit diagram of the logic combination unit 330 shown in FIG. 3, according to another embodiment of the present invention.

Referring to FIG. 6, a logic combination unit 330 shown in FIG. 3 according to another embodiment of the present invention may include AND gates 601, 602 and 603.

The logic combination unit 330 may generate the preliminary on/off signals PRE_9, PRE_10, PRE_11 and PRE_12 by performing an AND operation on the divided periodic waves OSC1, OSC2, OSC4 and OSC8 in the AND gates 601, 602 and 603.

Figure 7:
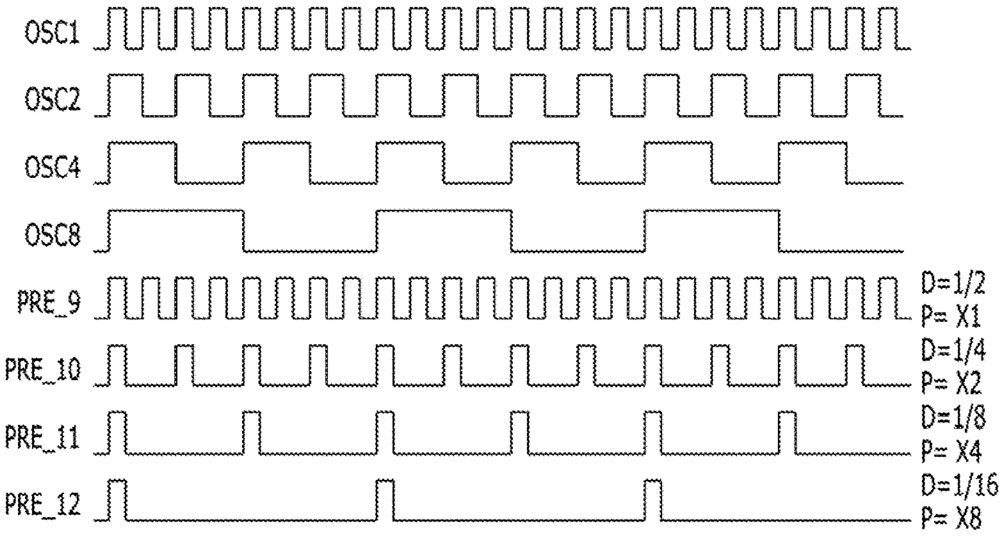
FIG. 7 is a timing diagram illustrating an operation of the logic combination unit of FIG. 6, according to another embodiment of the present invention.

Referring to FIG. 7, it may be seen that all the preliminary on/off signals PRE_9, PRE_10, PRE_11 and PRE_12 have different duty cycles (D) and periods (P).

Figure 8:
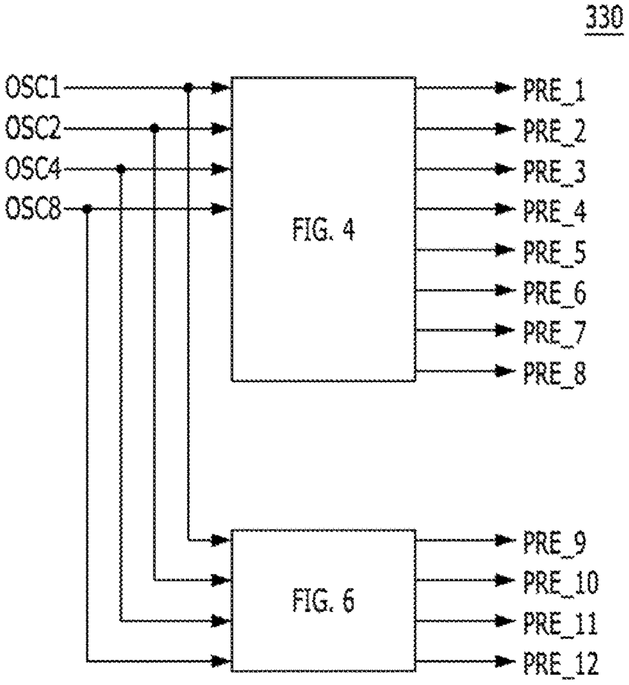
FIG. 8 is a schematic diagram of the logic combination unit 330 shown in FIG. 3 according to yet another embodiment of the present invention.

Referring to FIG. 8, a logic combination unit 330 shown in FIG. 3, according to yet another embodiment of the present invention may have a combination of the structure shown in FIG. 4 and the structure shown in FIG. 6. In this case, the logic combination unit 330 may generate 12 preliminary on/off signals PRE_1, PRE_2, PRE_3, PRE_4, PRE_5, PRE_6, PRE_7, PRE_8, PRE_9, PRE_10, PRE_11 and PRE_12.

The structures of the logic combination unit 330 described with reference to FIGS. 4 to 8 are mere examples for describing the present invention, and it is obvious to those skilled in the art that the logic combination unit 330 may be designed to generate preliminary on/off signals having diverse periods and duties by performing the logic combination in different ways on the divided periodic waves OSC1, OSC2, OSC4 and OSC8.

Figure 9:
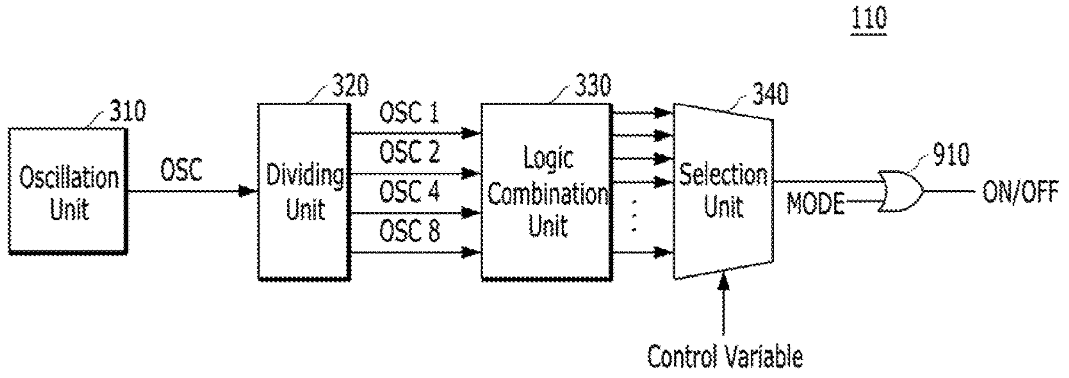
FIG. 9 is a schematic diagram of the periodic wave generator shown in FIG. 1, according to another embodiment of the present invention.

Referring to FIG. 9, a periodic wave generator 110 shown in FIG. 1, according to another embodiment of the present invention, may further include a mode control unit 910 in addition to the constituent elements shown in FIG. 3. The mode control unit 910 does not affect the on/off signal ON/OFF selected by the selection unit 340 in a first mode where a mode signal MODE is in a logic low level. However, the mode control unit 910 may keep the on/off signal ON/OFF in an enabled state, which is a logic high level, in a second mode where the mode signal MODE is in a logic high level. The mode control unit 910 may be an OR gate, as illustrated in the drawing.

The mode signal MODE may be a signal that is in a logic low level in the first mode where the internal voltage VINT is used relatively less, and in a logic high level in the second mode where the internal voltage VINT is used relatively more. In the second mode where the internal voltage VINT is used relatively more under the control of the mode control unit 910, the internal voltage generator 120 may be enabled continuously to stably generate the internal voltage VINT.

Figure 10:
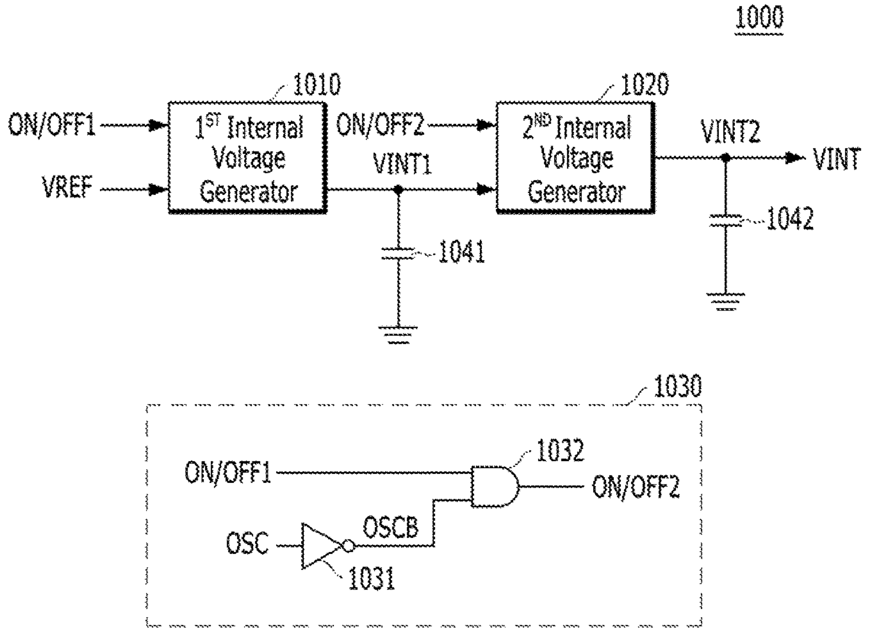
FIG. 10 is a schematic diagram of a voltage generation circuit 1000, according to a second embodiment of the present invention.

Referring to FIG. 10, a voltage generation circuit 1000 according to a second embodiment of the present invention may include a first internal voltage generator 1010, a second internal voltage generator 1020, an on/off splitter 1030, and capacitors 1041 and 1042.

The first internal voltage generator 1010 may generate a first internal voltage VINT1. The first internal voltage generator 1010 may be enabled/disabled in response to a first on/off signal ON/OFF1. The first internal voltage generator 1010 may be enabled when the first on/off signal ON/OFF1 is enabled and generate the first internal voltage VINT1. When the first on/off signal ON/OFF1 is disabled, the first internal voltage generator 1010 may be disabled, not consuming current. The capacitor 1041 may be used to maintain the first internal voltage VINT1 at a constant level. The first on/off signal ON/OFF1 may be a signal that is enabled/disabled periodically.

The second internal voltage generator 1020 may generate a second internal voltage VINT2 based on the first internal voltage VINT1. The second internal voltage generator 1020 may be enabled/disabled in response to a second on/off signal ON/OFF2. The second internal voltage generator 1020 may be enabled when the second on/off signal ON/OFF2 is enabled and generate the second internal voltage VINT2. When the second on/off signal ON/OFF2 is disabled, the second internal voltage generator 1020 may be disabled, not consuming current. The capacitor 1042 may be used to maintain the second internal voltage VINT2 at a constant level. The second on/off signal ON/OFF2 may be a signal that is enabled/disabled periodically. Since the second internal voltage generator 1020 generates the second internal voltage VINT2 based on the first internal voltage VINT1, it is required to stably maintain the first internal voltage VINT1 when the second internal voltage generator 1020 is enabled. Therefore, an enabling time period of the second on/off signal ON/OFF2 may be within an enabling time period of the first on/off signal ON/OFF1.

The on/off splitter 1030 may generate the second on/off signal ON/OFF2 by performing a logic combination operation on the first on/off signal ON/OFF1 and a periodic wave OSC. The on/off splitter 1030 may include an inverter 1031 and an AND gate 1032. The first on/off signal ON/OFF1 and the periodic wave OSC may be generated by the periodic wave generator 110 that is described above with reference to FIGS. 3 to 9.

Figure 11:
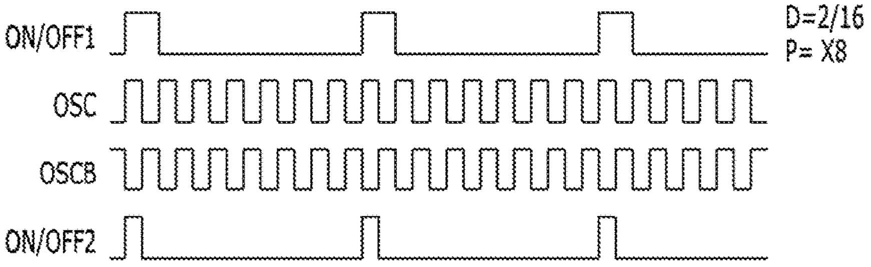
FIG. 11 is a timing diagram illustrating an operation of an on/off splitter of FIG. 10, according to the second embodiment of the present invention.

Referring to FIG. 11, the first on/off signal ON/OFF1 may be identical to the preliminary on/off signals PRE_4 of FIG. 4 having a period 8 times (P=×8) as long as that of the periodic wave OSC and having a duty cycle of 2/16 (D=2/16).

The inverter 1031 of the on/off splitter 1030 may invert the periodic wave OSC to generate an inverted periodic wave OSCB. The AND gate 1032 of the on/off splitter 1030 may perform an AND operation on the first on/off signal ON/OFF1 and the inverted periodic wave OSCB to generate the second on/off signal ON/OFF2.

As illustrated in FIG. 11, an enabling time period of the second on/off signal ON/OFF2 may be within an enabling time period of the first on/off signal ON/OFF1, and the length of the enabling time period of the second on/off signal ON/OFF2 may be shorter than the enabling time period of the first on/off signal ON/OFF1.

Figure 12:
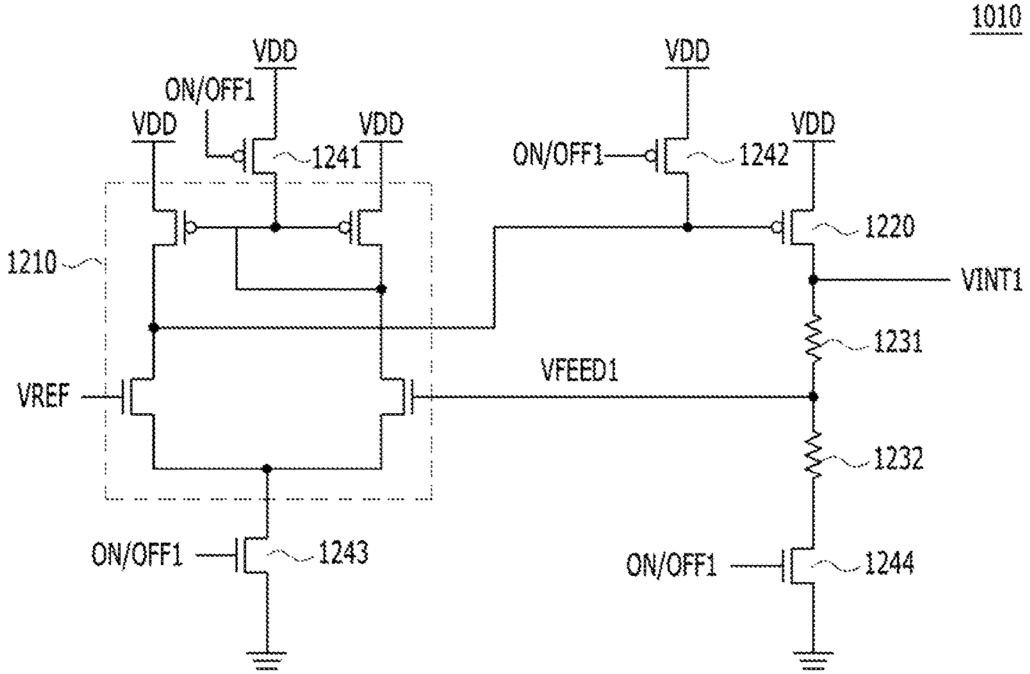
FIG. 12 is a circuit diagram of a first internal voltage generator 1010 shown in FIG. 10, according to an embodiment of the present invention.

Referring to FIG. 12, a first internal voltage generator 1010 shown in FIG. 10, according to an embodiment of the present invention, may include a comparator 1210 for comparing the first feedback voltage VFEED1 with a reference voltage VREF so as to generate a comparison result, a PMOS transistor 1220 for supplying the first internal voltage VINT1 based on the comparison result obtained by the comparator 1210, resistors 1231 and 1232 for dividing the first internal voltage VINT1 to generate the first feedback voltage VFEED1, and PMOS transistors 1241 and 1242 and NMOS transistors 1243 and 1244 that enable/disable the first internal voltage generator 1010 in response to the first on/off signal ON/OFF1.

When the first on/off signal ON/OFF1 is enabled to a logic high level, the NMOS transistors 1243 and 1244 may be turned on whereas the PMOS transistors 1241 and 1242 may be turned off so as to enable the first internal voltage generator 1010. The comparator 1210 may then compare the first feedback voltage VFEED1 with the reference voltage VREF to produce the comparison result. When the reference voltage VREF is higher than the first feedback voltage VFEED1, the PMOS transistor 1220 may be turned on to raise the first internal voltage VINT1. When the first feedback voltage VFEED1 is higher than the reference voltage VREF, the PMOS transistor 1220 may be turned off to decrease the first internal voltage VINT1. Through the process, the first feedback voltage VFEED1 and the reference voltage VREF may eventually become the same, and the first internal voltage VINT1 may be generated to have a voltage of [(R1+R2)/(R2)]*VREF, where R1 denotes a resistance value of the resistor 1231 and R2 denotes a resistance value of the resistor 1232.

When the first on/off signal ON/OFF1 is disabled to a logic low level, the NMOS transistors 1243 and 1244 may be turned off and the PMOS transistors 1241 and 1242 may be turned on to cut off the current flowing through the comparator 1210 and the current flowing through the resistors 1231 and 1232. In short, the first internal voltage generator 1010 may be disabled.

Figure 13:
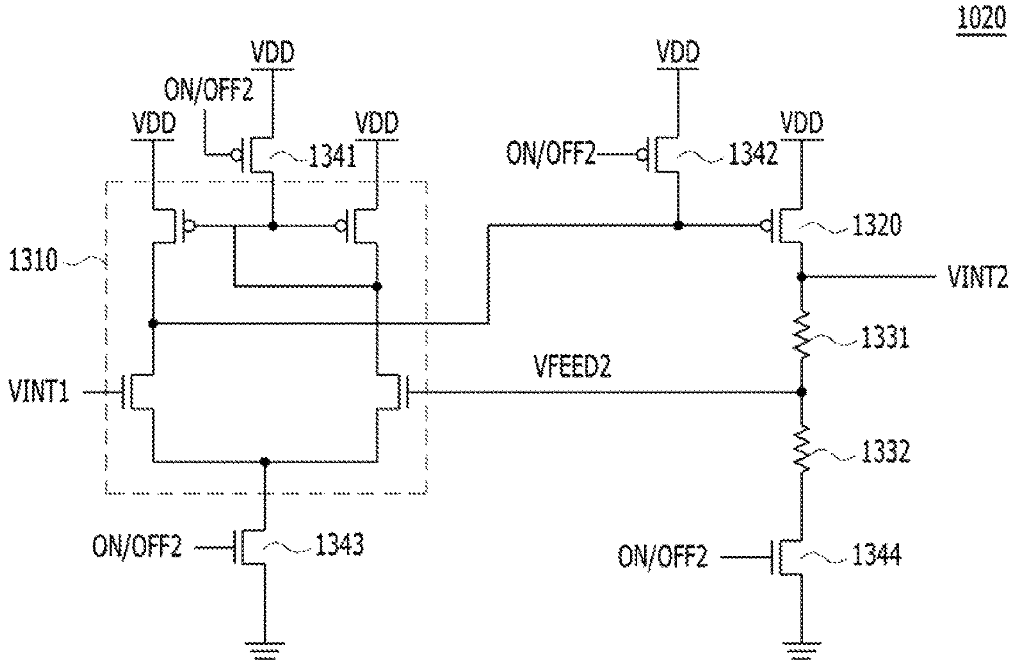
FIG. 13 is a circuit diagram of a second internal voltage generator shown in FIG. 10, according to an embodiment of the present invention.

Referring to FIG. 13, a second internal voltage generator 1020 shown in FIG. 10 according to an embodiment of the present invention may include a comparator 1310 for comparing the second feedback voltage VFEED2 with the first internal voltage VINT1 so as to generate a comparison result, a PMOS transistor 1320 for supplying the second internal voltage VINT2 based on the comparison result obtained by the comparator 1310, resistors 1331 and 1332 for dividing the second internal voltage VINT2 to generate the second feedback voltage VFEED2, and PMOS transistors 1341 and 1342 and NMOS transistors 1343 and 1344 that enable/disable the second internal voltage generator 1020 in response to the second on/off signal ON/OFF2.

The second internal voltage generator 1020 may be formed and operate the same as the first internal voltage generator 1010, except that the second internal voltage generator 1020 may be enabled/disabled in response to the second feedback voltage VFEED2 instead of the first feedback voltage VFEED1 and the comparator 1310 may use the first internal voltage VINT1 instead of the reference voltage VREF.

Figure 14:
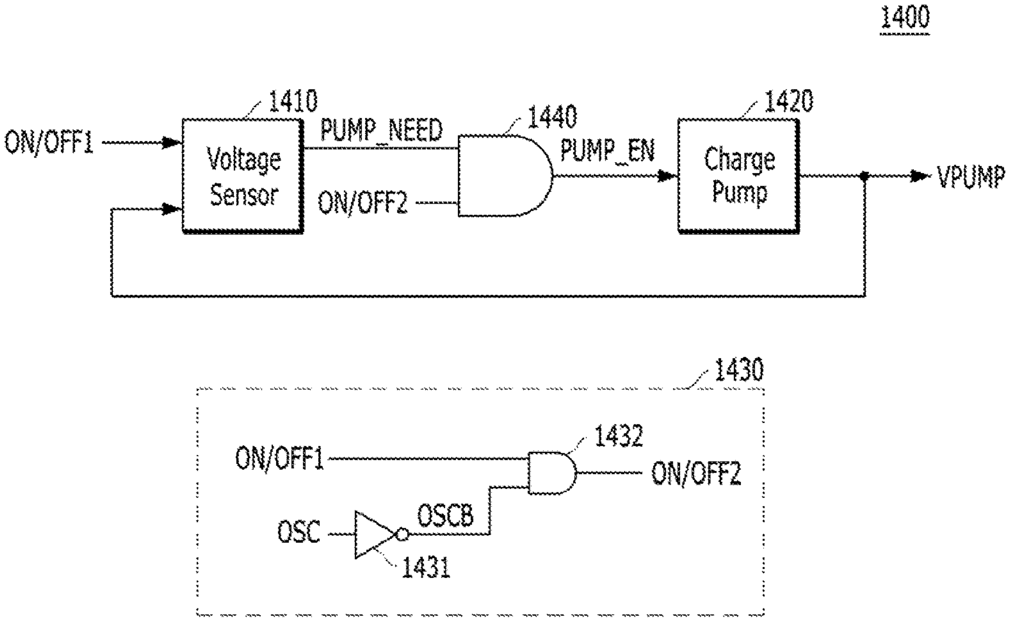
FIG. 14 is a schematic diagram of a voltage generation circuit 1400, according to a third embodiment of the present invention.

Referring to FIG. 14, a voltage generation circuit 1400, according to a third embodiment of the present invention, may include a voltage sensor 1410, a charge pump 1420, an on/off splitter 1430, and a pump enable controller 1440.

The voltage sensor 1410 may sense a pumping voltage VPUMP to generate a pump need signal PUMP_NEED. When the pumping voltage VPUMP is higher than a target level, the voltage sensor 1410 may disable the pump need signal PUMP_NEED. When the pumping voltage VPUMP is lower than a target level, the voltage sensor 1410 may enable the pump need signal PUMP_NEED. The voltage sensor 1410 may be enabled/disabled in response to a first on/off signal ON/OFF1. The first on/off signal ON/OFF1 may be enabled/disabled periodically.

When the pump need signal PUMP_NEED and a second on/off signal ON/OFF2 are enabled, the pump enable controller 1440 may enable a pump enable signal PUMP_EN for enabling the charge pump 1420. The second on/off signal ON/OFF2 may be enabled/disabled periodically. The charge pump 1420 may operate based on a sensing operation of the voltage sensor 1410. Therefore, when the charge pump 1420 is enabled, the voltage sensor 1410 has to perform the sensing operation exactly. Therefore, the enabling time period of the second on/off signal ON/OFF2 may be within the enabling time period of the first on/off signal ON/OFF1.

The on/off splitter 1430 may logically combine the first on/off signal ON/OFF1 and a periodic wave OSC to generate the second on/off signal ON/OFF2. The on/off splitter 1430 may include an inverter 1431 and an AND gate 1432. The first on/off signal ON/OFF1 and the periodic wave OSC may be generated by the periodic wave generator 110 described with reference to FIGS. 3 to 9. The on/off splitter 1430 may operate as illustrated in FIG. 11.

The charge pump 1420 may be enabled when the pump enable signal PUMP_EN is enabled, and perform a pumping operation to raise the level of the pumping voltage VPUMP. The pumping voltage VPUMP may be higher than an external power source voltage applied from the exterior of an integrated circuit.

Figure 15:
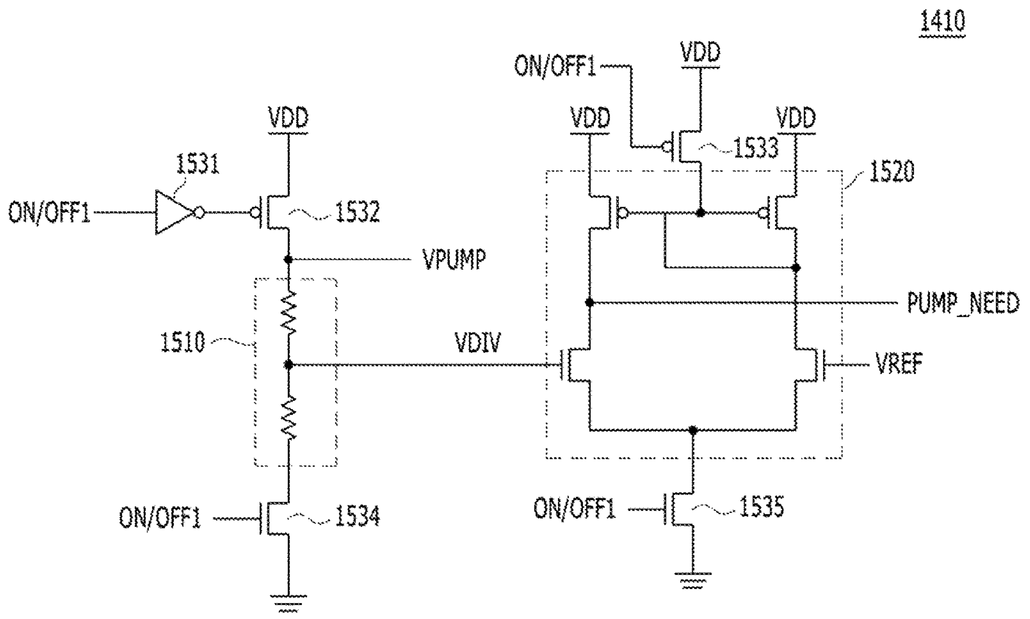
FIG. 15 is a circuit diagram of a voltage sensor shown in FIG. 14, according to an embodiment of the present invention.

Referring to FIG. 15, a voltage sensor 1410 shown in FIG. 14, according to a third embodiment of the present invention, may include a voltage divider 1510 for dividing the pumping voltage VPUMP, and a comparator 1520 for comparing a divided voltage VDIV obtained by the voltage divider 1510 with a reference voltage VREF to generate the pump need signal PUMP_NEED. Also, the voltage sensor 1410 may include an inverter 1531 for enabling/disabling the voltage sensor 1410 in response to the first on/off signal ON/OFF1, PMOS transistors 1532 and 1533 and NMOS transistors 1534 and 1535.

When the first on/off signal ON/OFF1 is enabled, the PMOS transistor 1532 and the NMOS transistors 1534 and 1535 may be turned on to enable the voltage divider 1510 and the comparator 1520. When the divided voltage VDIV is lower than the reference voltage VREF, the comparator 1520 may decide that the pumping voltage VPUMP needs to be raised and enable the pump need signal PUMP_NEED to a logic high level. When the divided voltage VDIV is higher than the reference voltage VREF, the comparator 1520 may decide that the pumping voltage VPUMP does not have to be raised and disable the pump need signal PUMP_NEED to a logic low level.

When the first on/off signal ON/OFF1 is disabled, the PMOS transistor 1532 and the NMOS transistors 1534 and 1535 may be turned off and the PMOS transistor 1533 may be turned on. As a result, the current flowing through the voltage divider 1510 and the comparator 1520 may be cut off, thereby disabling the voltage sensor 1410.

Figure 16:
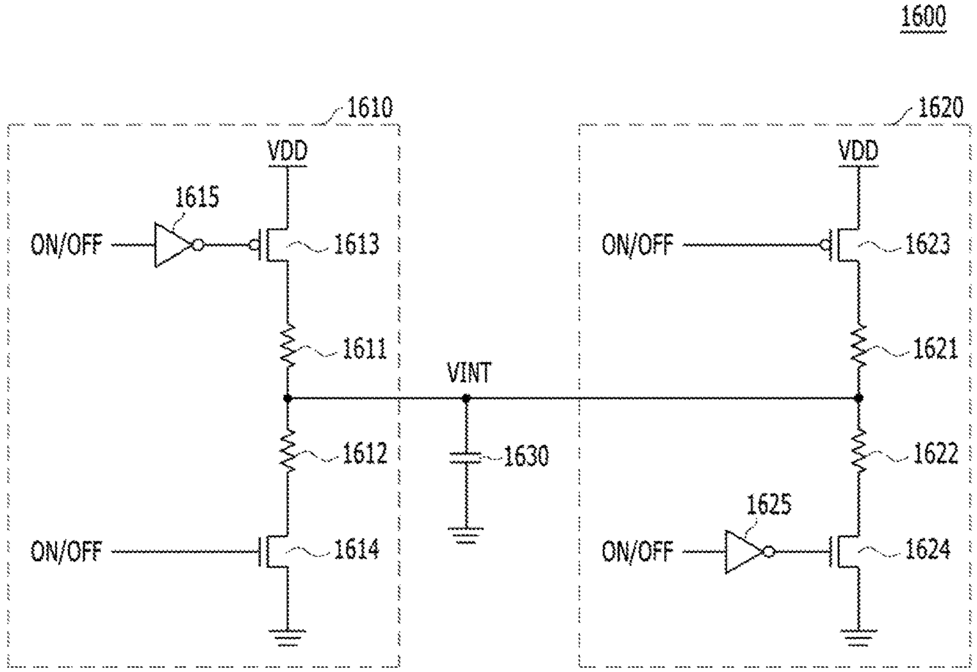
FIG. 16 is a circuit diagram of a voltage generation circuit 1600, according to a fourth embodiment of the present invention.

Referring to FIG. 16, a voltage generation circuit 1600, according to a fourth embodiment of the present invention, may include a first internal voltage generator 1610, a second internal voltage generator 1620, and a capacitor 1630.

The first internal voltage generator 1610 may be enabled when an on/off signal ON/OFF is in a first level (which may be a logic high level, for example) and generate an internal voltage VINT. The first internal voltage generator 1610 may include resistors 1611 and 1612 for voltage division, and transistors 1613 and 1614 and an inverter 1615 for enabling/disabling the first internal voltage generator 1610 in response to the on/off signal ON/OFF. The on/off signal ON/OFF may be generated by the periodic wave generator 110 described earlier with reference to FIGS. 3 to 9.

The second internal voltage generator 1620 may be enabled when the on/off signal ON/OFF is in a second level (which may be a logic low level, for example) and generate the internal voltage VINT. The second internal voltage generator 1620 may include resistors 1621 and 1622 for voltage division, and transistors 1623 and 1624 and an inverter 1625 for enabling/disabling the second internal voltage generator 1620 in response to the on/off signal ON/OFF. A resistance ratio between the resistors 1621 and 1622 of the second internal voltage generator 1620 may be the same as a resistance ratio between the resistors 1611 and 1612 of the first internal voltage generator 1610. For example, the second internal voltage generator 1620 and the first internal voltage generator 1610 may each generate the same internal voltage VINT. However, the resistors 1621 and 1622 of the second internal voltage generator 1620 may have greater resistance than the resistors 1611 and 1612 of the first internal voltage generator 1610. For example, if the resistance value of the resistors 1611 and 1612 of the first internal voltage generator 1610 is 100Ω, the resistance value of the resistors 1621 and 1622 of the second internal voltage generator 1620 may be 200Ω.

The first internal voltage generator 1610 may supply the internal voltage VINT stronger, in other words, more stable, than the second internal voltage generator 1620, but the first internal voltage generator 1610 may consume more current. Therefore, it is possible to stably maintain the internal voltage VINT by alternately enabling the first internal voltage generator 1610 and the second internal voltage generator 1620 and save on power consumption, compared with a case where the first internal voltage generator 1610 is enabled continuously.

Figure 17:
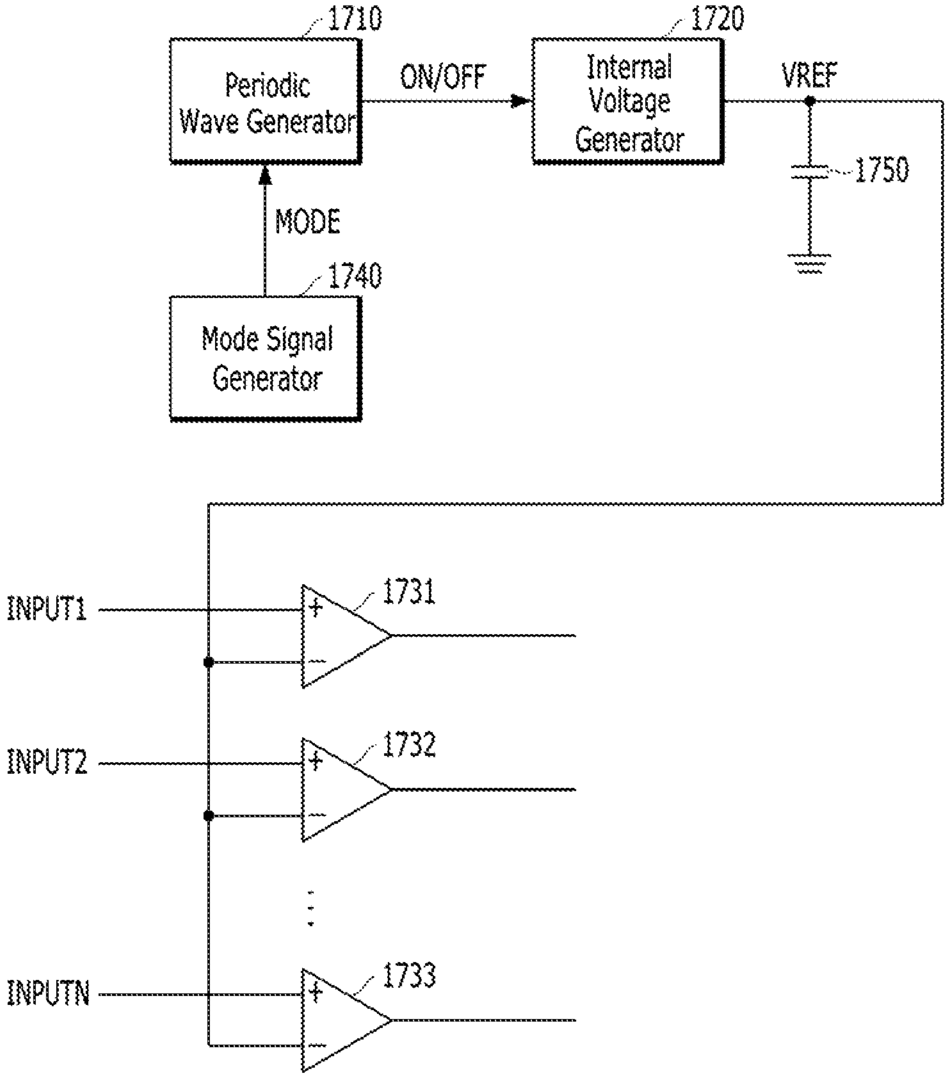
FIG. 17 is a schematic diagram of an integrated circuit, according to an embodiment of the present invention.

Referring to FIG. 17, an integrated circuit, according to an embodiment of the present invention, may include a periodic wave generator 1710, an internal voltage generator 1720, first to $N^{th}$ reception circuits 1731 to 1733, where N is an integer greater than 1, a mode signal generator 1740, and a capacitor 1750.

The periodic wave generator 1710 may generate an on/off signal ON/OFF. In a first mode where a mode signal MODE is in a logic low level, the periodic wave generator 1710 may periodically enable/disable the on/off signal ON/OFF. In a second mode where a mode signal MODE is in a logic high level, the periodic wave generator 1710 may maintain the on/off signal ON/OFF at an enabled state. The periodic wave generator 1710 may be formed as illustrated in FIG. 9.

The mode signal generator 1740 may generate a mode signal MODE. The mode signal generator 1740 may generate the mode signal MODE at a logic low level for a time period where input signals INPUT1 to INPUTN are not inputted from the exterior of the integrated circuit. For a time period where input signals INPUT1 to INPUTN are inputted from the exterior of the integrated circuit, the mode signal generator 1740 may generate the mode signal MODE at a logic high level. In a case where the integrated circuit is a memory device (such as, for example, a Dynamic Random Access Memory (DRAM) device) and the input signals INPUT1 to INPUTN are data, the data are not likely to be inputted when there is no active row in the memory device. Therefore, the mode signal generator 1740 may generate the mode signal MODE in a logic low level for a time where there is no active row in the memory device, and generate the mode signal MODE in a logic high level for a time period where there is an active row in the memory device.

The internal voltage generator 1720 may be enabled/disabled in response to the on/off signal ON/OFF and generate a reference voltage VREF, which is an internal voltage. The internal voltage generator 1720 may have the structure illustrated in FIG. 2, or the structure illustrated in FIG. 12.

The first to $N^{th}$ reception circuits 1731 to 1733 may compare the first to $N^{th}$ input signals INPUT1 to INPUTN with the reference voltage VREF and receive the first to $N^{th}$ input signals INPUT1 to INPUTN. Each of the first to $N^{th}$ reception circuits 1731 to 1733 may recognize a corresponding input signal as a logic high signal when a level of the corresponding input signal is higher than the reference voltage VREF. When a level of the corresponding input signal is lower than the reference voltage VREF, the reception circuit may recognize the corresponding input signal as a logic low signal.

Referring to FIG. 17, the internal voltage generator 1720 may be enabled in the first mode where the first to $N^{th}$ input signals INPUT1 to INPUTN are received and supply the reference voltage VREF of a stable level to the first to $N^{th}$ reception circuits 1731 to 1733. In the second mode where the first to $N^{th}$ input signals INPUT1 to INPUTN are not received, the internal voltage generator 1720 may be disabled to reduce power consumption.

According to the embodiments of the present invention, it is possible to cut down current consumption of a voltage generation circuit.

While the present invention has been described with respect to the specific embodiments, it will be apparent to those skilled in the art to which this invention pertains that various changes and modifications may be made without departing from the spirit and scope of the invention as defined in the following claims.

For example, we note, that in some instances, as would be apparent to those skilled in the art to which this invention pertains, a feature or element described in connection with one embodiment may also be employed singly or in combination with other features or elements of another embodiment, unless specifically indicated otherwise.

What is claimed is:

1. A voltage generation circuit, comprising:

a periodic wave generator suitable for generating an on/off signal that is periodically enabled/disabled, wherein at least one of a period and a duty cycle of the on/off signal is controlled based on at least one information of temperature information, capacitance information, leakage current information, speed information, and voltage level information; and an internal voltage generator suitable for being enabled/disabled in response to the on/off signal and generating an internal voltage, wherein the periodic wave generator includes:

an oscillation unit suitable for generating a periodic wave;

a dividing unit for dividing the periodic wave into a plurality of divided periodic waves;

a logic combination unit suitable for logically combining the plurality of the divided periodic waves and thereby generating preliminary on/off signals having diverse frequencies and duties; and a selection unit suitable for selecting one signal among the preliminary on/off signals as the on/off signal in response to at least one information of the temperature information, the capacitance information, the leakage current information, the speed information, and the voltage level information.

2. The voltage generation circuit of claim 1, wherein the temperature information is generated by a temperature sensor mounted on an integrated circuit including the voltage generation circuit.

3. The voltage generation circuit of claim 1, wherein the capacitance information, the leakage current information, and the voltage level information are stored in a non-volatile memory device suitable for storing values determined during a test of an integrated circuit including the voltage generation circuit.

4. The voltage generation circuit of claim 1, wherein the speed information is stored in a register suitable for storing setup information of an integrated circuit including the voltage generation circuit.

5. The voltage generation circuit of claim 1, wherein the on/off signal is periodically enabled/disabled in a first mode, and maintained in an enabled state in a second mode.

* * * * *